US006885210B1

(12) United States Patent
Suzuki

(10) Patent No.: US 6,885,210 B1
(45) Date of Patent: Apr. 26, 2005

(54) SYSTEM AND METHOD FOR MEASURING TRANSISTOR LEAKAGE CURRENT WITH A RING OSCILLATOR WITH BACKBIAS CONTROLS

(75) Inventor: Shingo Suzuki, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/672,793

(22) Filed: Sep. 26, 2003

Related U.S. Application Data

(63) Continuation-in-part of application No. 10/124,152, filed on Apr. 16, 2002.

(51) Int. Cl.[7] ................................................ G01R 31/02

(52) U.S. Cl. ...................................................... 324/763

(58) Field of Search ................................ 324/760–765, 324/158.1, 73.1; 331/55, 57, 65–66, 75; 714/733–736; 326/81–83, 86; 327/51, 57, 541, 534–538

(56) References Cited

U.S. PATENT DOCUMENTS

| | | | | | |
|---|---|---|---|---|---|
| 4,739,252 | A | * | 4/1988 | Malaviya et al. | 324/158.1 |
| 5,410,278 | A | * | 4/1995 | Itoh et al. | 331/57 |
| 5,568,103 | A | * | 10/1996 | Nakashima et al. | 331/57 |
| 6,011,403 | A | * | 1/2000 | Gillette | 324/763 |
| 6,407,571 | B1 | * | 6/2002 | Furuya et al. | 324/765 |
| 6,426,641 | B1 | * | 7/2002 | Koch et al. | 324/765 |
| 6,657,504 | B1 | * | 12/2003 | Deal et al. | 324/763 |
| 6,815,971 | B1 | * | 11/2004 | Wang et al. | 324/765 |

* cited by examiner

Primary Examiner—David Zarneke
Assistant Examiner—Jermele Hollington
(74) Attorney, Agent, or Firm—Wagner Murabito & Hao LLP

(57) ABSTRACT

A circuit and method thereof for measuring leakage current are described. The circuit includes a pre-charge device subject to a first backbias voltage and a leakage test device subject to a second backbias voltage. The leakage test device is coupled to the pre-charge device. The leakage test device is biased to an off state. A differential amplifier is coupled to the pre-charge device and the leakage test device. A delay unit is coupled to the differential amplifier and to an input of the pre-charge device. The pre-charge device is turned on and off at a frequency that corresponds to said leakage current.

34 Claims, 16 Drawing Sheets

NMOS
IOFF CURRENT

PMOS
IOFF CURRENT

NMOS GATE
LEAKAGE CURRENT

PMOS GATE
LEAKAGE CURRENT

SYSTEM AND METHOD FOR MEASURING TRANSISTOR LEAKAGE CURRENT WITH A RING OSCILLATOR WITH BACKBIAS CONTROLS

CROSS REFERENCE TO RELATED APPLICATION

This Application is a Continuation-in-Part of the co-pending, commonly-owned U.S. patent application, Ser. No. 10/124,152, filed Apr. 16, 2002, by S. Suzuki et al., and entitled "A System and Method for Measuring Transistor Leakage Current with a Ring Oscillator."

BACKGROUND OF THE INVENTION

1. Field of the Invention

Embodiments of the present invention relate to the field of semiconductor devices. More specifically, embodiments of the present invention relate to the measurement of leakage current in a semiconductor device.

2. Related Art

One of the challenges facing the users and designers of integrated circuits is managing the power produced by a chip. The power dissipated by a digital chip has two basic sources: switching current, and leakage current. When a gate is switching from one logical value to another, there is a brief period of time when current passes through the transistors dissipating power in the form of heat. Historically, this switching current has been the focus of attention because it was substantially greater than the nominal leakage current that occurred when the gate was not switching and the transistors were "off."

However, with smaller geometries and reduced operating voltages, the leakage current is a significantly larger proportion of the power production problem. Thus, chip designers need to develop both on-chip and off-chip techniques for dealing with leakage current. One challenge faced by designers is accurately measuring the amount of leakage current that is actually present on a particular chip.

Back gate biasing ("backbias") is commonly used to control the leakage current, and another challenge here is measuring the amount of leakage current under various backbias conditions.

SUMMARY OF THE INVENTION

Circuits and methods thereof for measuring leakage current with backbias control are described.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Reference will now be made in detail to the present embodiments of the invention, examples of which are illustrated in the accompanying drawings. While the invention will be described in conjunction with the present embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description, for purposes of explanation, numerous specific details are set forth in order to provide a thorough understanding of the present invention. It will be apparent, however, to one skilled in the art, upon reading this disclosure, that the present invention may be practiced without these specific details. In other instances, well-known structures and devices are not described in detail in order to avoid obscuring aspects of the present invention.

Figure 1:
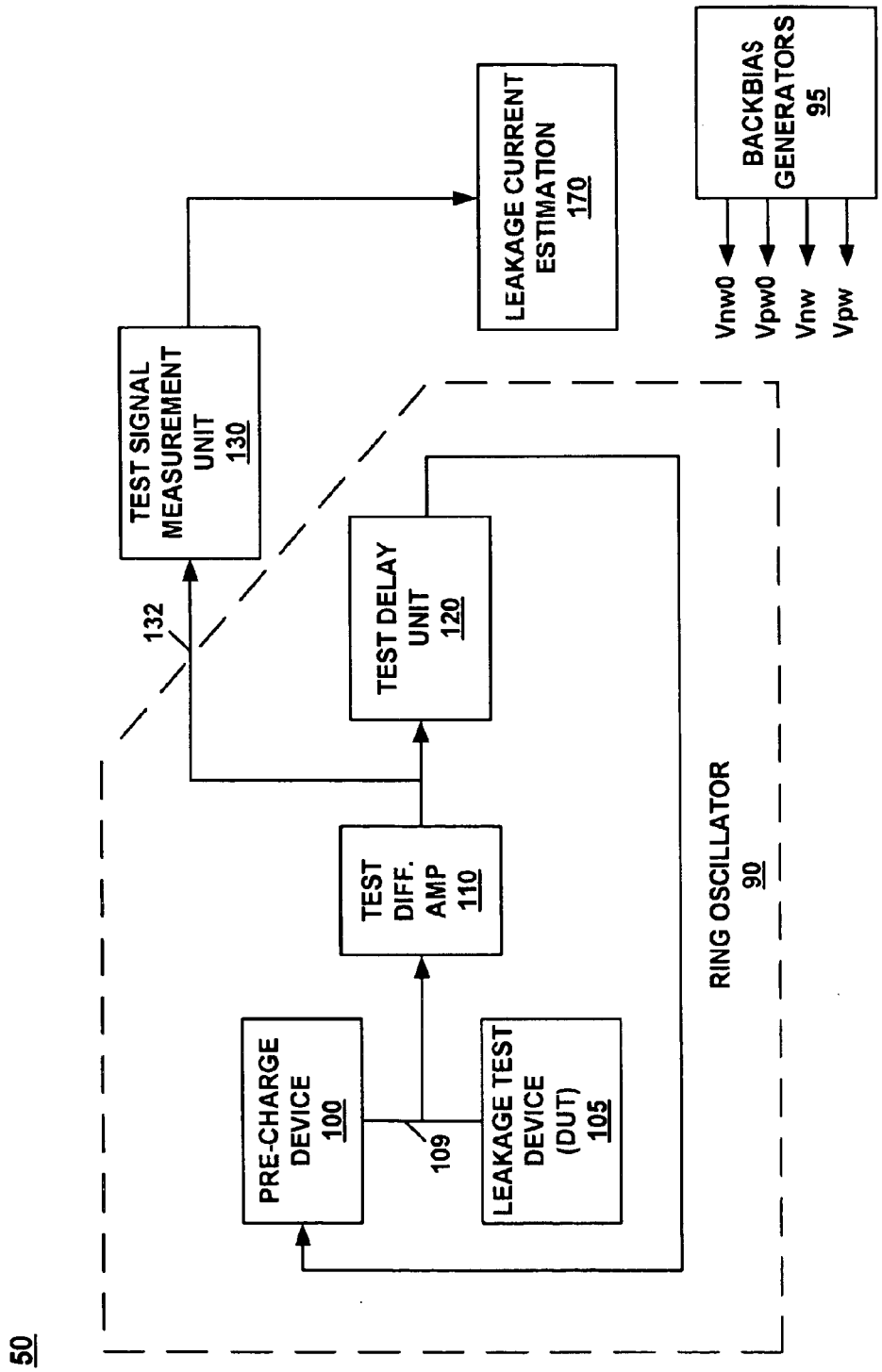
FIG. 1 is a block diagram of a leakage current measurement system with backbias control according to an embodiment of the present invention.

FIG. 1 is a block diagram of a leakage current measurement system 50 with backbias control according to an embodiment of the present invention. In the present embodiment, leakage current measurements system 50 includes a ring oscillator 90 that includes a pre-charge device 100, a leakage test device 105, a differential amplifier 110, and a delay unit 120. The leakage test device 105 is also known as a device under test (DUT). The leakage test device 105 is biased to the off-state. The leakage test device 105 and the pre-charge device 100 together form a dynamic node driver.

Backbias generators 95 generate back gate biasing ("backbias") voltages Vnw0, Vpw0, Vnw and Vpw. Vnw is applied to leakage test device 105 when the DUT is a positive-channel metal-oxide semiconductor (PMOS) device. Vpw is applied to leakage test device 105 when the DUT is a negative-channel metal-oxide semiconductor (NMOS). Vnw0 is applied to pre-charge device 100 when the pre-charge device is a PMOS device. Vnw0 is also applied to other PMOS devices that may be present in the system 50. Vpw0 is applied to pre-charge device 100 when the pre-charge device is an NMOS device. Vpw0 is also applied to other NMOS devices that may be present in the system 50.

Vnw0, Vpw0, Vnw and Vpw can be controlled separately (independently) from each other. Thus, Vnw0, Vpw0, Vnw and Vpw can each have different values. For example, in one implementation of the system 50, Vnw0 is set to the supply voltage Vdd and Vpw0 is set to ground, with Vnw or Vpw (depending on the type of DUT) independently controlled to another voltage. Alternatively, a voltage can be tied with another voltage. For example, in another implementation of the system 50, Vpw is equal to Vpw0 when the DUT is an NMOS device (or Vnw equal to Vnw0 when the DUT is a PMOS device). As used herein, a "type" of device refers to either a PMOS type of device or an NMOS device.

When the pre-charge device 100 is turned on, it brings the dynamic node 109 up to Vdd. When the pre-charge device 100 is turned off, the leakage current associated with the leakage test device 105 will result in bleed off of the charge accumulated at the dynamic node 109. Turning on and off the pre-charge device 100 generates a periodic signal with a frequency that is directly related to the leakage current. A high leakage current results in a relatively high frequency while a low leakage current results in a relatively low frequency. The delay unit 120 in combination with the differential amplifier 110 and the pre-charge device 100 present an odd number of inversions around the loop formed by the ring oscillator 90.

In the present embodiment, the periodic signal generated by ring oscillator 90 is tapped at test signal node 132. Note that the test signal can be obtained from any point within the ring oscillator 90. The test signal measurement unit 130 conditions the test signal at the test signal node 132, running it through one or more flip-flops (or a comparable numbers of latches) and measuring the fundamental frequency of the test signal. The leakage current estimation unit 170 performs a calculation using the measured frequency to estimate the leakage current in the leakage test device 105. The leakage current estimation unit 170 can be embodied as software or as hardware.

Figure 2:
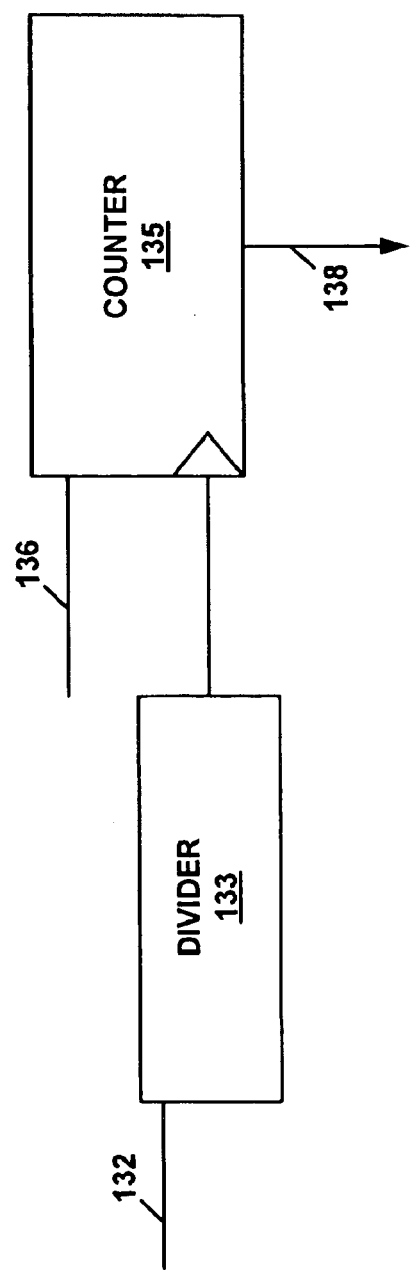
FIG. 2 is a block diagram of one embodiment of a signal measurement unit that can be used in the leakage measurement system of FIG. 1 in accordance with the present invention.

FIG. 2 is a block diagram of one embodiment of a signal measurement unit 130 that can be used in the leakage measurement system 50 of FIG. 1 in accordance with the present invention. A signal generated by ring oscillator 90 (FIG. 1) is conditioned by running it through a divider 133 having one or more flip-flops (or a comparable numbers of latches). In one embodiment, the divider 133 serves to convert the test signal from a pulse to a waveform with a 50 percent duty cycle. In another embodiment, the divider 133 serves to divide the frequency of the test signal to a suitable level for the counter 135.

The signal produced by the divider 133 increments counter 135. The counter 135 has a reset 136 that is strobed with a periodic timing signal generated from a system clock or other stable and well-defined timing signal. The counter value 138 thus represents the number of cycles in the test signal during one period of the periodic timing signal. The counter value 138 is thus proportional to the frequency of the test signal.

Figure 3:
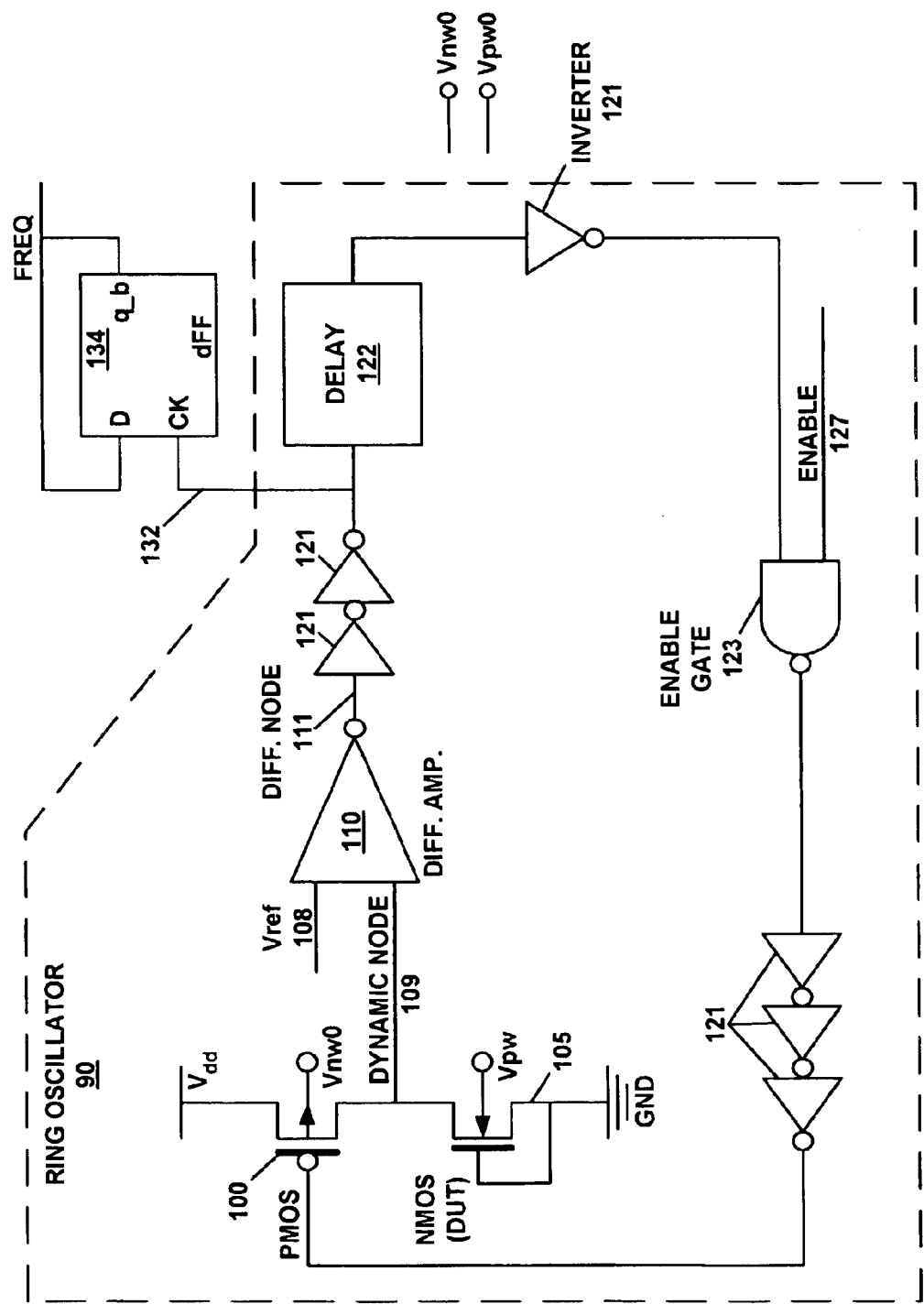
FIG. 3 is a schematic diagram of one embodiment of a ring oscillator with backbias control that can be used in the leakage current measurement system of FIG. 1 in accordance with the present invention.

FIG. 3 is a schematic diagram of one embodiment of a ring oscillator 90 with backbias control that can be used in the leakage current measurement system 50 of FIG. 1 in accordance with the present invention. In this embodiment, the pre-charge device 100 is a PMOS device and the leakage test device 105 is an NMOS device. In this embodiment, the pre-charge device 100 is coupled to Vdd and the leakage test device 105 is coupled to ground (GND).

In the present embodiment, the pre-charge device 100 and the leakage test device 105 are subject to backbias voltages Vnw0 and Vpw, respectively. The backbias voltages are controlled through the terminals Vnw0, Vpw0, and Vpw. The backbias voltage of the leakage test device 105 (e.g., Vpw) can be controlled separately (independently) from the other backbias voltages.

Alternatively, the backbias voltage of the leakage test device 105 can be tied with Vpw0 (e.g., Vpw=Vpw0).

Figure 4:
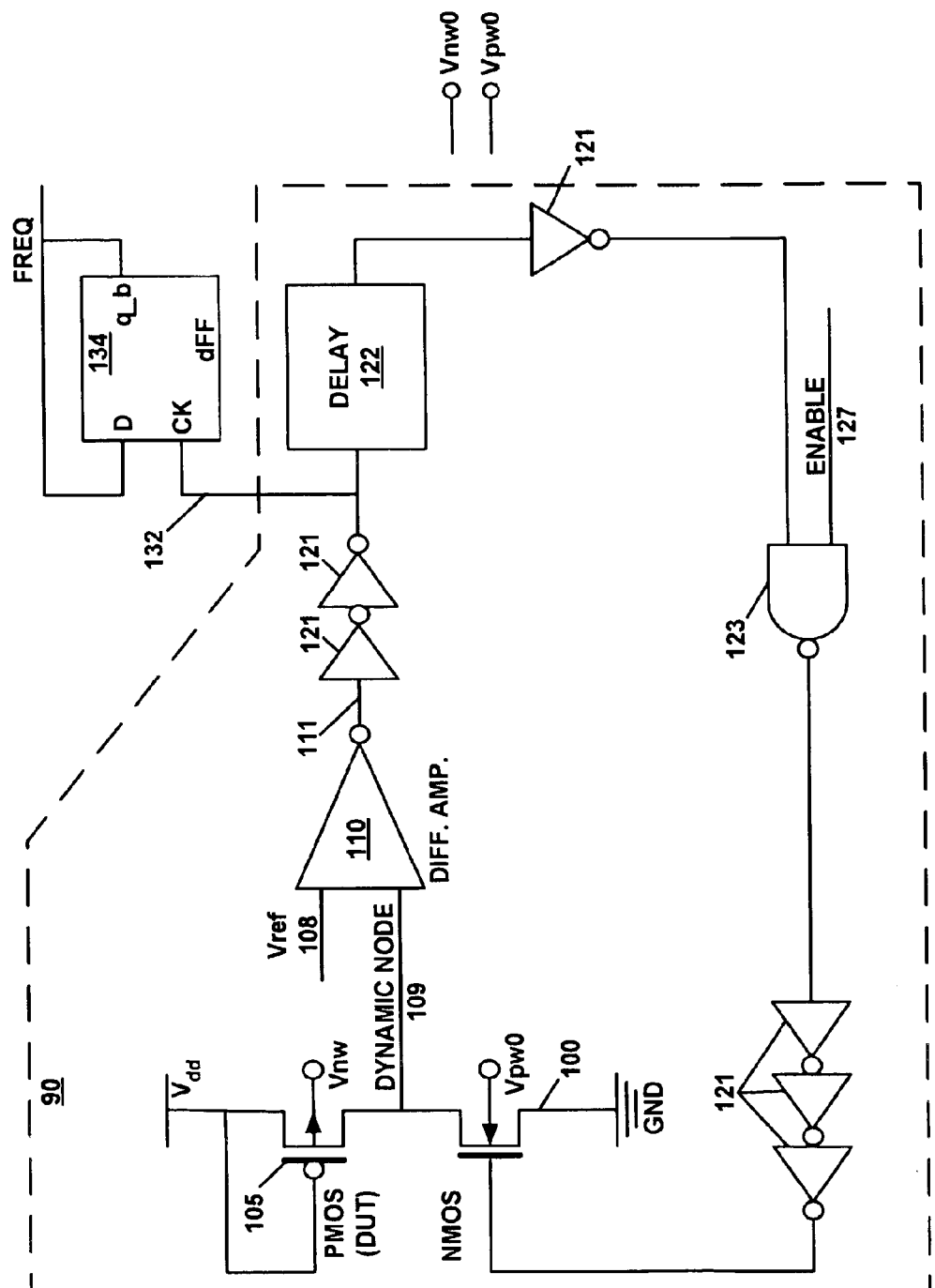
FIG. 4 is a schematic diagram of a second embodiment of a ring oscillator with backbias control that can be used in the leakage current measurement system of FIG. 1 in accordance with the present invention.

FIG. 4 is a schematic diagram of a second embodiment of a ring oscillator 90 with backbias control that can be used in the leakage current measurement system 50 of FIG. 1 in accordance with the present invention.

In this embodiment, the pre-charge device 100 is an NMOS device and the leakage test device 105 is a PMOS device. In this embodiment, the pre-charge device 100 is coupled to GND and the leakage test device 105 is coupled to Vdd.

In the present embodiment, the pre-charge device 100 and the leakage test device 105 are subject to backbias voltages Vpw0 and Vnw, respectively. The backbias voltages are controlled through the terminals Vnw0, Vpw0, and Vnw. The backbias voltage of the leakage test device 105 (e.g., Vnw) can be controlled separately (independently) from the other backbias voltages. Alternatively, the backbias voltage of the leakage test device 105 can be tied with Vnw0 (e.g., Vnw=Vnw0).

With reference to FIGS. 3 and 4, the differential amplifier 110 compares the voltage of the dynamic node 109 with a reference voltage 108 (Vref). The differential amplifier 110 can be replaced with one or more inverters. In one embodiment, Vref is taken to be one-half of Vdd.

The differential amplifier 110 produces a signal at differential node 111. The delay unit in this embodiment is composed of a sequence of inverters 121. The delay unit in this embodiment also includes an enabling gate 123 with an enable input 127. The enable input 127 can be used to stop the ring oscillator 90 from operating.

The flip-flop 134 (or a comparable latch) is part of the divider 133 of FIG. 2. If desired, additional delay can be placed in supplemental delay unit 122. Supplemental delay unit 122 is configured to mirror the delay associated with the flip-flop 134. Accordingly, supplemental delay unit 122 can be composed of a flip-flop like flip-flop 134.

The systems of FIGS. 1, 3 and 4 are now described in operation. After the backbias voltages (e.g., Vnw0, Vpw0, and Vnw or Vpw depending on the type of DUT) are set, the ring oscillator 90 is initialized by setting the enable input 127 to a low value. This prevents oscillation and yet turns the pre-charge device 100 on. Turning on the pre-charge device 100 drives the dynamic node 109 to a high value in the system of FIG. 3, and to a low value in the system of FIG. 4. When the enable input 127 also goes to a high value, the pre-charge device 100 is turned off. However, the dynamic node 109 is initially at a value greater value than Vref in the system of FIG. 3, or at a value less than Vref in the system of FIG. 4. The differential amplifier 110 and the delay elements (121 and 122) initially keep the pre-charge device 100 turned off. Although the leakage test device 105 is biased to the off-state, it does have a leakage current that bleeds off the charge at the dynamic node 109 until the dynamic node 109 voltage reaches Vref (in the system of FIG. 3, the dynamic node voltage is reduced to Vref; in the system of FIG. 4, the dynamic node voltage is raised to Vref). At that point, the differential amplifier 110 drives the differential node 111 to a high level that in turn activates (turns on) the pre-charge device 100. The pre-charge device 100 then quickly brings the voltage at the dynamic node 109 back to a high level that in turn causes the differential amplifier 100 to set the differential node 111 to a low level. The process then repeats, thereby generating a periodic signal with a frequency that is directly related to the leakage current. The periodic signal generated by ring oscillator 90 is tapped at test signal node 132.

Referring to FIG. 1, the test signal measurement unit 130 conditions the test signal at the test signal node 132, and the leakage current estimation unit 170 performs a calculation using the measured frequency to estimate the leakage current in the leakage test device 105.

In one embodiment, the average leakage current (per unit length) of a leakage test device 105 can be estimated with the following relationship:

$$I_{off} = \frac{C \cdot (V_{dd} - V_{ref}) \cdot 2^n f_t}{W}; \quad (1)$$

where n is the number of flip-flops before initiating counting in the test signal measurement unit 130, W is the effective width of the leakage test device 105, C is the capacitance of the dynamic node 109, $V_{dd}$ is the supply voltage, $V_{ref}$ is the reference voltage used in the differential amplifier 110, and $f_t$ is the frequency measured by the test signal measurement unit 130. The effective width of the leakage test device is described by FIGS. 15–18, below.

In one embodiment, the average leakage current (per unit area) of a leakage test device 105 can be estimated with the following relationship:

$$I_{off} = \frac{C \cdot (V_{dd} - V_{ref}) \cdot 2^n f_t}{L \cdot W}; \quad (2)$$

where n is the number of flip-flops before initiating counting in the test signal measurement unit 130, W is the effective width of the leakage test device 105, L is the effective length of the leakage test device 105, C is the capacitance of the dynamic node 109, $V_{dd}$ is the supply voltage, $V_{ref}$ is the reference voltage used in the differential amplifier 110, and $f_t$ is the frequency of the test signal measured by the test signal measurement unit 130. The effective width of the leakage test device is described by FIGS. 17 and 18, below.

Equations (1) and (2) are based on an assumption that the delay through the differential amplifier 110 and the delay unit 120 is negligible compared to the time it takes for the leakage test device 105 to reduce the voltage at the dynamic node 109. In some cases the delay through the differential amplifier 110 and the delay unit 120 may be significant compared to the fall time of the dynamic node 109. To measure the leakage current in that situation, reference is made to FIG. 5, which shows a reference circuit 60 coupled to the leakage current measurement system 50 of FIG. 1 in accordance with one embodiment of the present invention.

Figure 5:
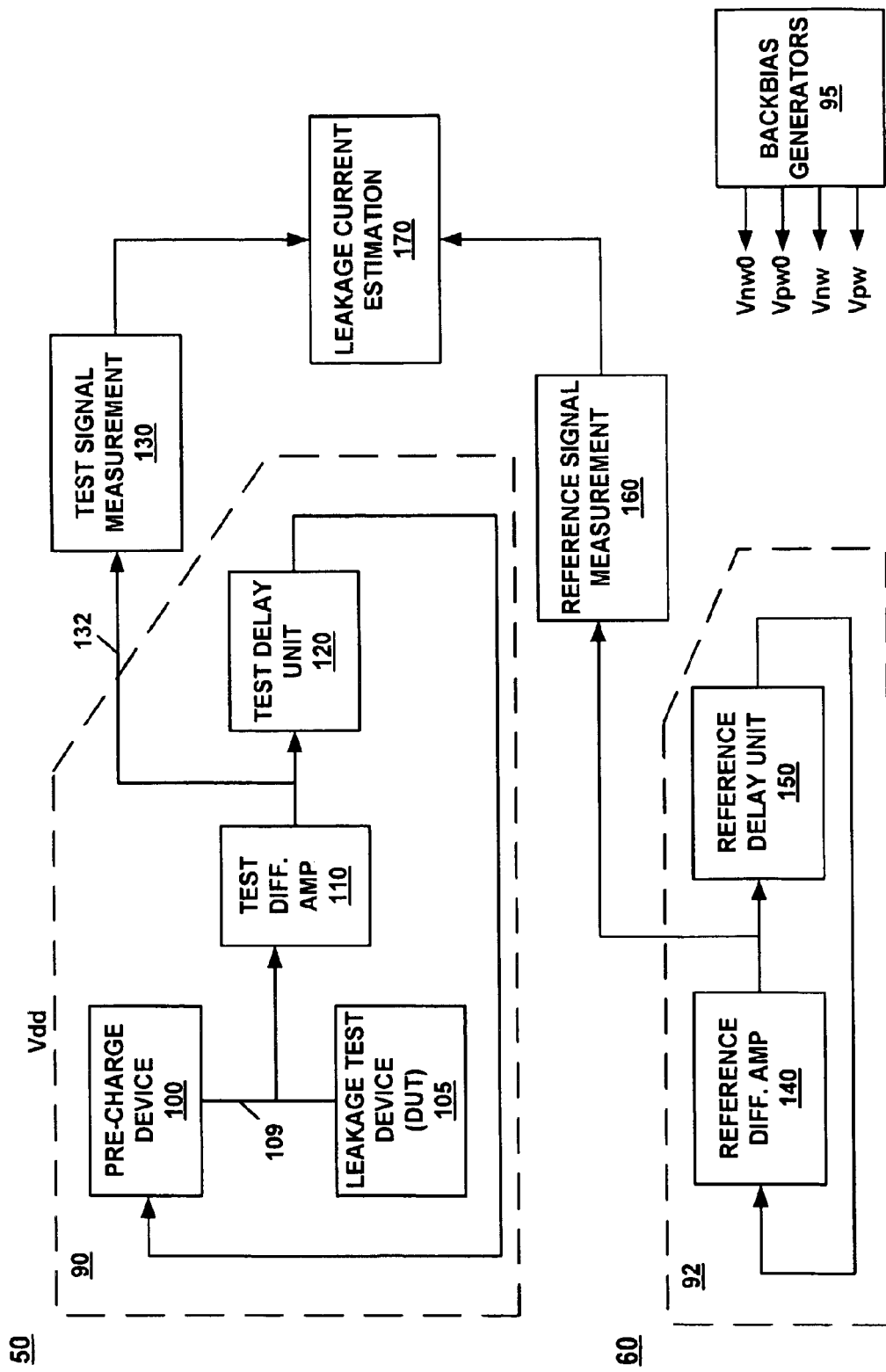
FIG. 5 is a block diagram of a reference circuit coupled with the leakage current measurement system of FIG. 1 in accordance with one embodiment of the present invention.

Reference circuit 60 of FIG. 5 includes a reference ring oscillator 92 that includes a reference differential amplifier 140 and a reference delay unit 150. The reference delay unit 150 can be similar in structure and composition to the delay unit 120. The reference ring oscillator 92 produces a reference signal with a fundamental frequency that is measured by the reference signal measurement unit 160. The reference signal measurement unit 160 can be similar in structure and composition to the test signal measurement unit 130. The leakage current estimation unit 170 uses information about the test signal from system 50 and the reference test signal from reference circuit 60 to compute an estimate of the leakage current, as described further below (see FIGS. 10A and 10B).

Figure 6:
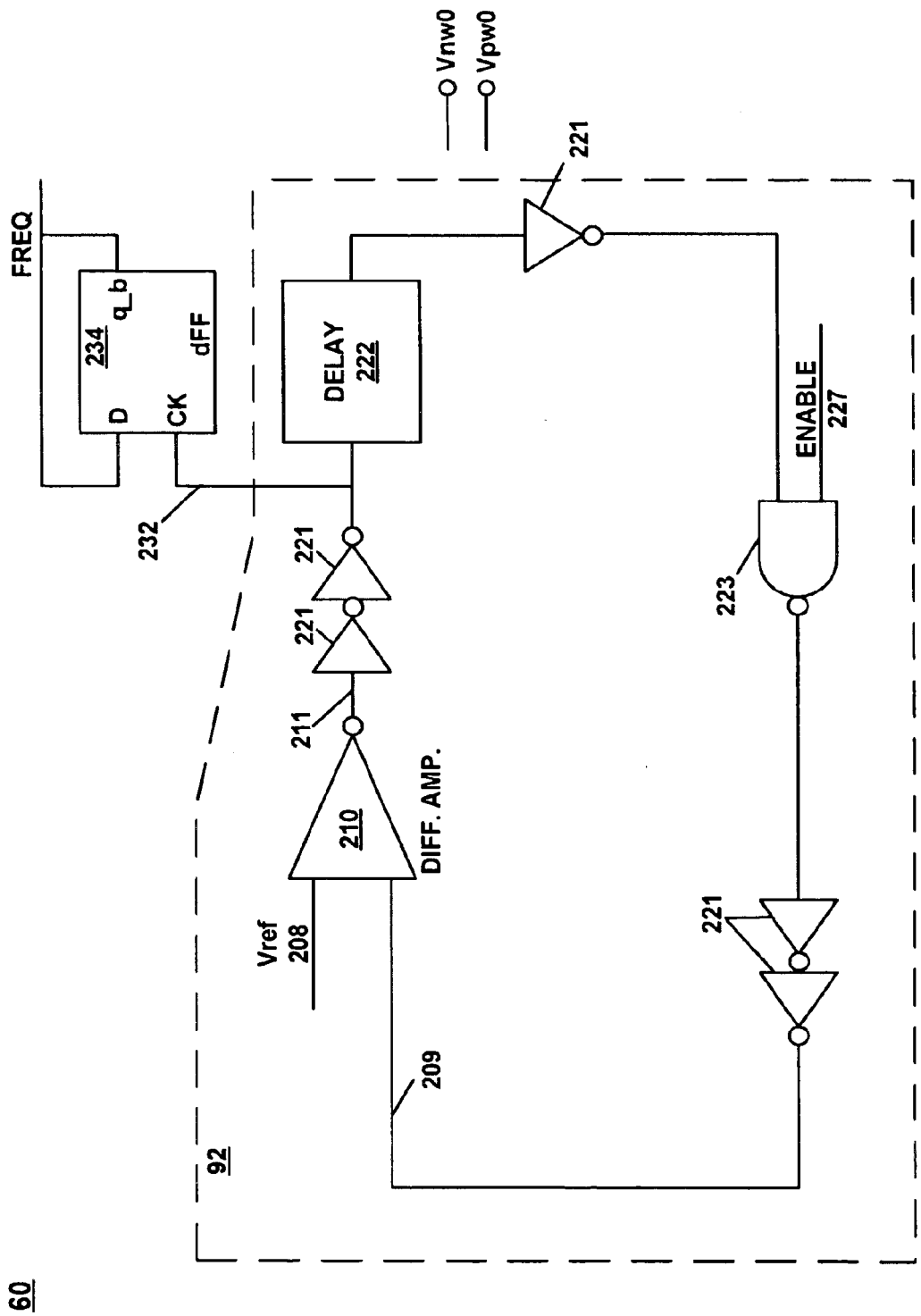
FIG. 6 is a schematic diagram of one embodiment of the reference circuit of FIG. 5 in accordance with the present invention.

First, reference is made to FIG. 6, which is a schematic diagram of one embodiment of the reference circuit 60 of FIG. 5 in accordance with the present invention. The backbias voltages (Vpw0 and Vnw0) for the reference ring oscillator 92 are set to the same backbias voltages used by ring oscillator 90 (FIG. 5). In the present embodiment, the reference differential amplifier 210 compares the voltage of the reference node 209 with a reference voltage 208 (Vref). In one embodiment, Vref is taken to be one-half of Vdd. The reference differential amplifier 210 produces a signal at differential node 211. The reference delay unit 150 (FIG. 5) in this embodiment is composed of a sequence of inverters 221. The delay unit in this embodiment also includes an enabling gate 223 with an enable input 227. The enable input 227 can be used to stop the reference oscillator shown from operating.

With reference to FIG. 6, the flip-flop 234 (or a comparable latch) is part of the reference signal measurement unit 160. If desired, additional delay can be placed in supplemental delay unit 222. Supplemental delay unit 222 is configured to mirror the delay associated with the flip-flop 234. Accordingly, supplemental delay unit 222 can be composed of a flip-flop like flip-flop 234.

The differential amplifier 210 can be replaced with one or more inverters. The components of the reference ring oscillator 92 are adjusted and selected to produce a delay around the loop that is comparable to the delay found in the test differential amplifier 110 and test delay unit 120 of FIG. 5.

Figure 7:
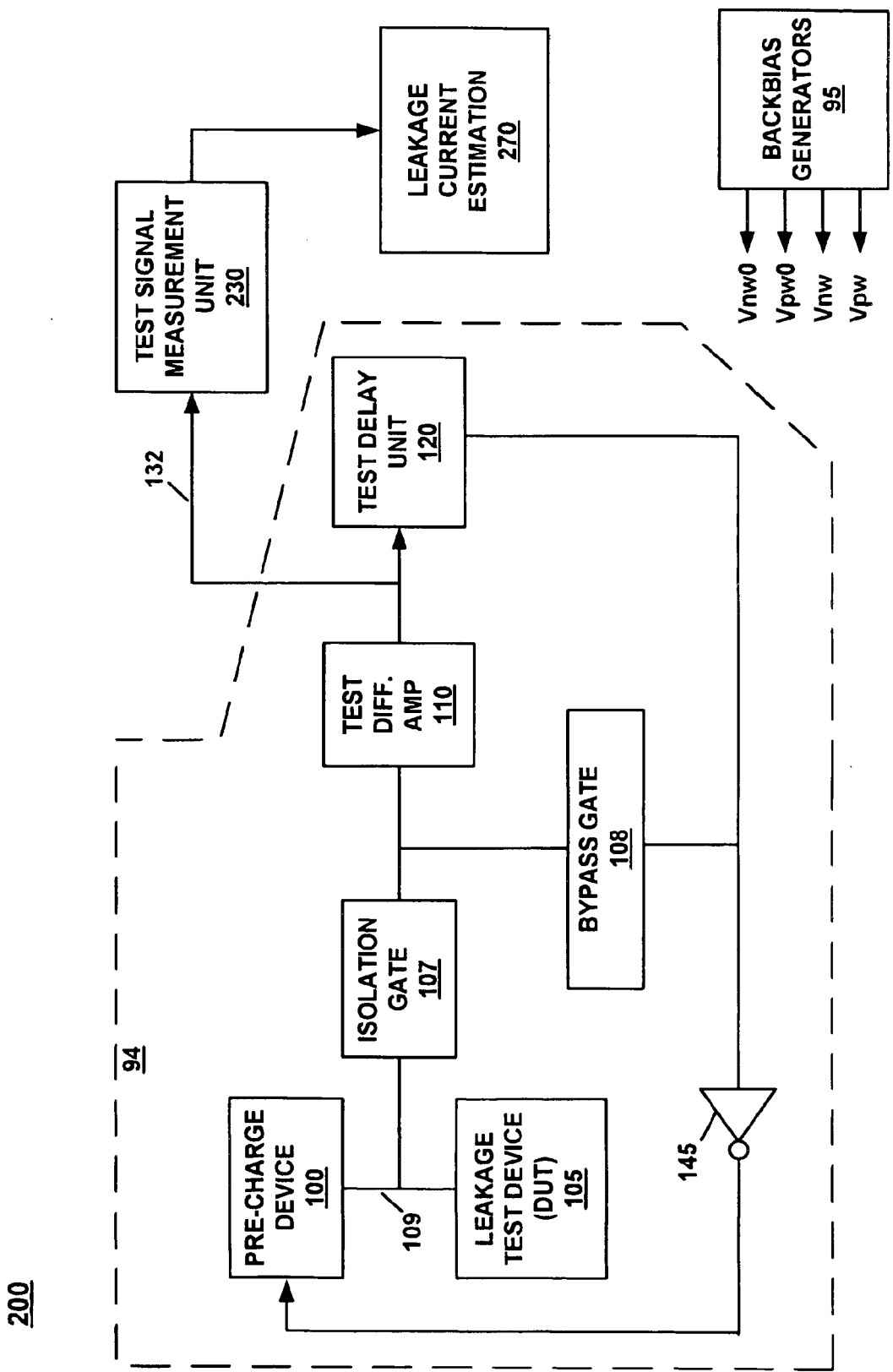
FIG. 7 is a block diagram of a leakage current measurement system with backbias control and sharing components with a reference circuit in accordance with one embodiment of the present invention.

FIG. 7 is a block diagram of one embodiment of a leakage current measurement system 200 integrating the reference oscillator and the test oscillator as ring oscillator 94, in which the differential amplifier and most of the delay unit are shared. The components are in essence the same as in the embodiment shown in FIG. 1, with the addition of isolation gate 107 and bypass gate 108. For correct operation, at least one inverter 145 is extracted from the delay unit 120 and placed after the connection to the bypass gate 108. The backbias voltages are controlled through the terminals Vpw0, Vnw0, Vnw and Vpw.

Figure 8:
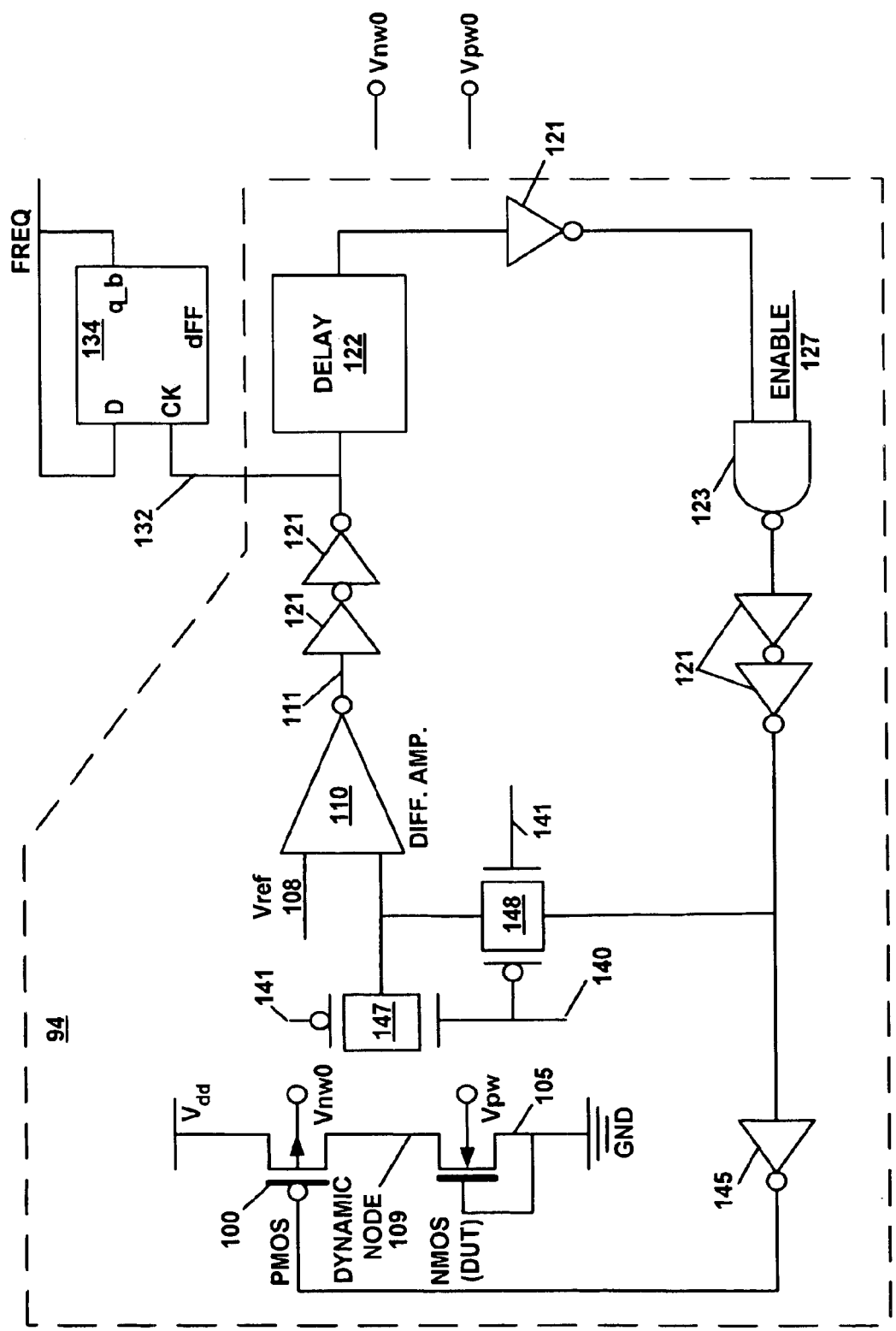
FIG. 8 is a schematic diagram of one embodiment of a ring oscillator that can be used in the leakage current measurement system of FIG. 7 in accordance with the present invention.

FIG. 8 is a schematic diagram of one embodiment of a ring oscillator 94 that can be used in the leakage current measurement system of FIG. 7 in accordance with the present invention. In this embodiment, the pre-charge device 100 is a PMOS device and the leakage test device 105 is an NMOS device. In this embodiment, the pre-charge device 100 is coupled to Vdd and the leakage test device 105 is coupled to GND. The backbias voltages are controlled through the terminals Vpw0, Vnw0, and Vpw.

Figure 9:
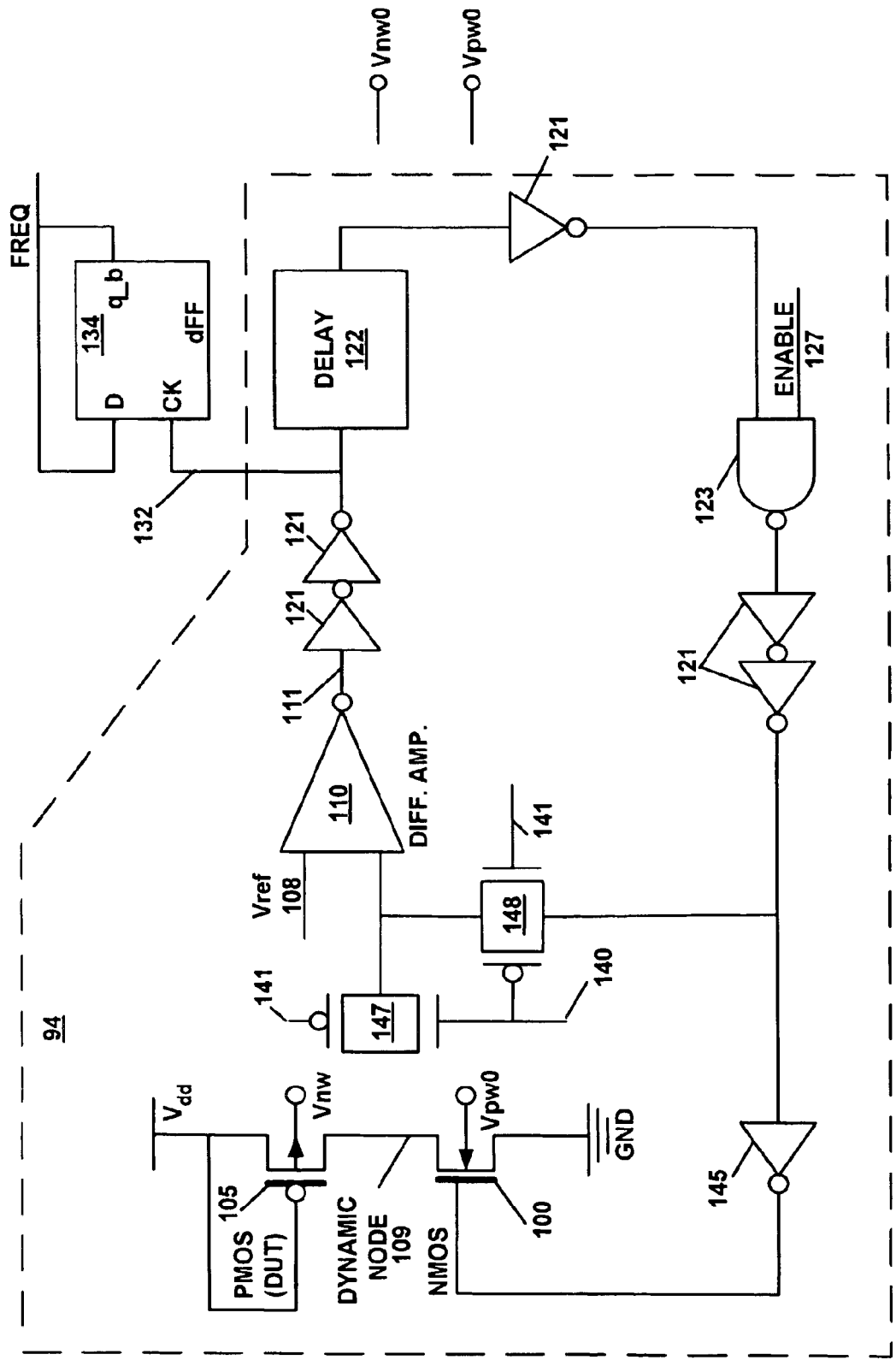
FIG. 9 is a schematic diagram of a second embodiment of a ring oscillator that can be used in the leakage current measurement system of FIG. 7 in accordance with the present invention.

FIG. 9 is a schematic diagram of a second embodiment of a ring oscillator 94 that can be used in the leakage current measurement system of FIG. 7 in accordance with the present invention. In this embodiment, the pre-charge device 100 is an NMOS device and the leakage test device 105 is a PMOS device. In this embodiment, the pre-charge device 100 is coupled to GND and the leakage test device 105 is coupled to Vdd. The backbias voltages are controlled through the terminals Vpw0, Vnw0, and Vnw.

With reference to FIGS. 8 and 9, ring oscillator 94 utilizes a shared differential amplifier 110 and delay unit 120 to generate both a reference signal and a test signal. The isolation gate 107 is implemented as a pass gate 147. The bypass gate 108 is implemented as another pass gate 148. A test mode signal 140 and the test mode signal negation 141 control the pass gates 147 and 148. To make effective measurements, the transistors forming the pass gates 147 and 148 are significantly smaller than the leakage test device 105.

The systems of FIGS. 7–9 are now described in operation. After the backbias voltages are set, to generate a test signal using the leakage test device 105, the isolation gate 107 is activated and the bypass gate 108 is deactivated. In this first mode, the signal measurement unit 230 measures the frequency of the test signal. To generate a reference signal, the isolation gate 107 is deactivated and the bypass gate 108 is activated, thus isolating the leakage test device 105. In this second mode, the signal measurement unit 230 measures the frequency of the reference signal. The leakage current estimation unit 280 estimates the leakage current with time-separated measurements made by the signal measurement unit 230 with the ring oscillator 94 in each of the first and second modes.

In one embodiment, when a reference circuit such as those described above in conjunction with FIGS. 5 and 7 is used, the average leakage current (per unit length) of a leakage test device 105 can be estimated with the following relationship:

$$I_{off} = \frac{C \cdot (V_{dd} - V_{ref}) \cdot 2^n}{W \cdot ((1/f_t) - (1/f_r))}; \quad (3)$$

where n is the number of flip-flops before initiating counting in the test signal measurement unit 130, W is the effective width of the leakage test device 105, C is the capacitance of the dynamic node 109, $V_{dd}$ is the supply voltage, $V_{ref}$ is the reference voltage used in the differential amplifier 110, $f_t$ is the frequency measured by the test signal measurement unit 130, and $f_r$ is the frequency measured by the reference signal measurement unit 160.

In one embodiment, when a reference circuit such as those described above in conjunction with FIGS. 5 and 7 is used, the average leakage current (per unit area) of a leakage test device 105 can be estimated with the following relationship:

$$I_{off} = \frac{C \cdot (V_{dd} - V_{ref}) \cdot 2^n}{L \cdot W \cdot ((1/f_t) - (1/f_r))}; \quad (4)$$

where n is the number of flip-flops before initiating counting in the test signal measurement unit 130, W is the effective width of the leakage test device 105, L is the effective length of the leakage test device 105, C is the capacitance of the dynamic node 109, $V_{dd}$ is the supply voltage, $V_{ref}$ is the reference voltage used in the differential amplifier 110, $f_t$ is the frequency of the test signal measured by the test signal measurement unit 130, and $f_r$ is the frequency measured by the reference signal measurement unit 160.

Figure 10A:
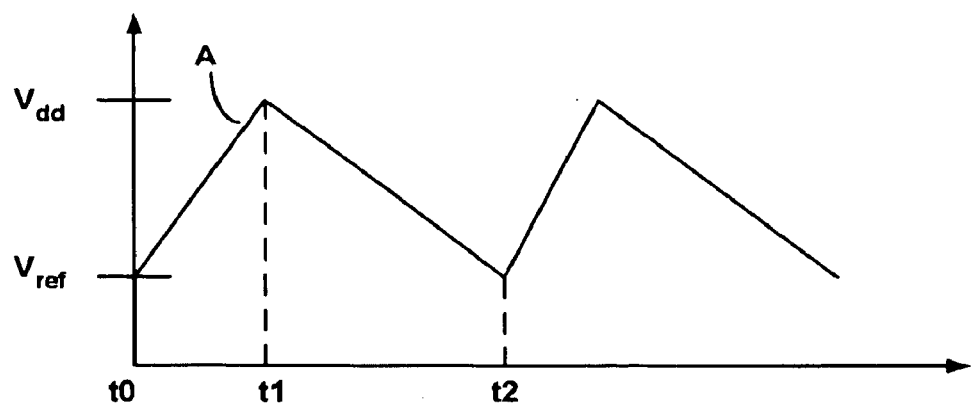
FIGS. 10A and 10B illustrate examples of test signals generated in accordance with embodiments of the present invention.
Figure 10B:
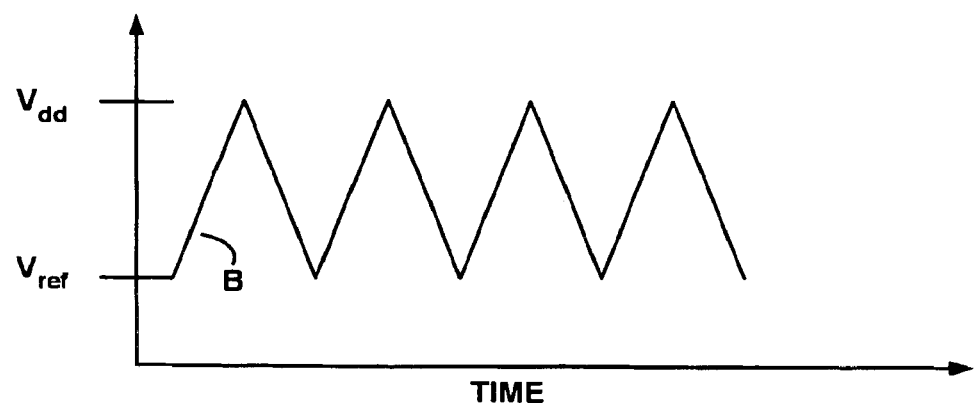

FIGS. 10A and 10B illustrate examples of test signals generated in accordance with embodiments of the present invention. FIG. 10A shows a test signal that is output from a ring oscillator such as ring oscillator 90 (FIG. 1) or ring oscillator 94 (FIG. 7) operating in the first mode. With reference to FIG. 1, for example, FIG. 10A represents a case in which the pre-charge device 100 is a PMOS device and leakage test device 105 is an NMOS device.

When the time $t_1$ through the differential amplifier 110 and the delay unit 120 is negligible compared to the time $t_2$ it takes for the leakage test device 105 to reduce the voltage at the dynamic node 109, then the leakage current can be estimated using equations (1) and (2). However, when $t_1$ is significant compared to $t_2$ (perhaps on the order of five to ten percent), then a reference test signal such as that illustrated by FIG. 10B can be generated using a reference ring oscillator such as ring oscillator 92 (FIG. 5) or ring oscillator 94 operating in the second mode. The portion B of the reference test signal of FIG. 10B is matched to the portion A of the test signal of FIG. 10A. In effect, using equations (3) and (4), the test signal of FIG. 10B is subtracted from the test signal of FIG. 10A to determine the leakage current.

Figure 11:
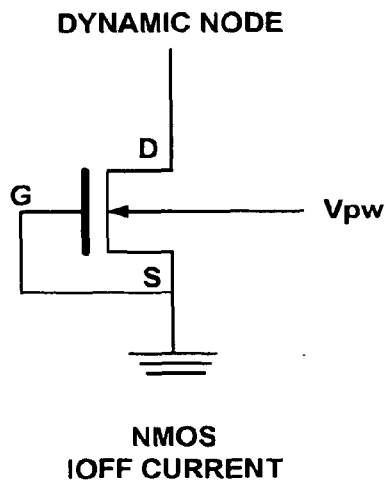
FIG. 11 is one embodiment of a negative-channel metal-oxide semiconductor (NMOS) transistor with backbias control in accordance with the present invention.
Figure 12:
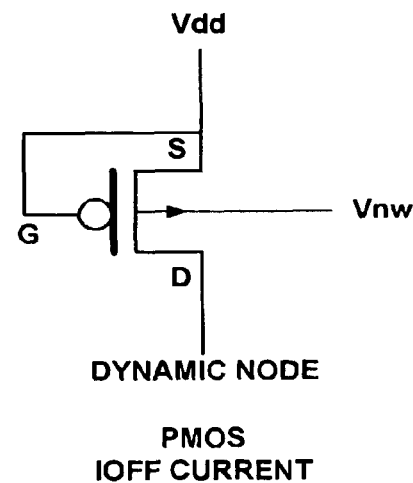
FIG. 12 is one embodiment of a positive-channel metal-oxide semiconductor (PMOS) transistor with backbias control in accordance with the present invention.
Figure 13:
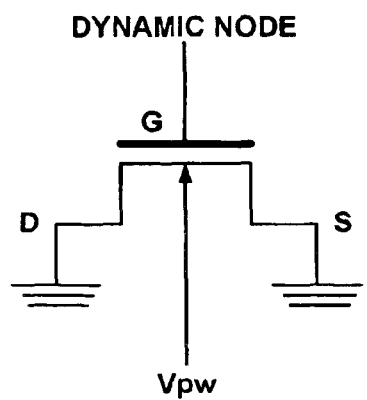
FIG. 13 is a second embodiment of a NMOS transistor with backbias control in accordance with the present invention.
Figure 14:
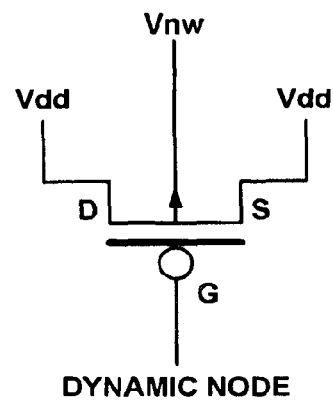
FIG. 14 is a second embodiment of a PMOS transistor with backbias control in accordance with the present invention.

FIG. 11 shows a schematic for one embodiment of an NMOS device 204 that can be used as a leakage test device for measuring transistor leakage current with backbias voltage control (Vpw). FIG. 12 shows a schematic for one embodiment of a PMOS device 205 that can be used as a leakage test device for measuring transistor leakage current with backbias voltage control (Vnw). FIG. 13 shows a schematic for one embodiment of an NMOS device 206 that can be used as a leakage test device for measuring the gate leakage current with backbias voltage control (Vpw). FIG. 14 shows a schematic for one embodiment of a PMOS device 207 that can be used as a leakage test device for measuring gate leakage current with backbias voltage control (Vnw).

Because of non-uniformities in semiconductor manufacturing processes, the leakage current of a transistor can vary depending on its geometric orientation. To address this, a leakage test device can be constructed out of several transistors with different geometric orientations.

Figure 15:
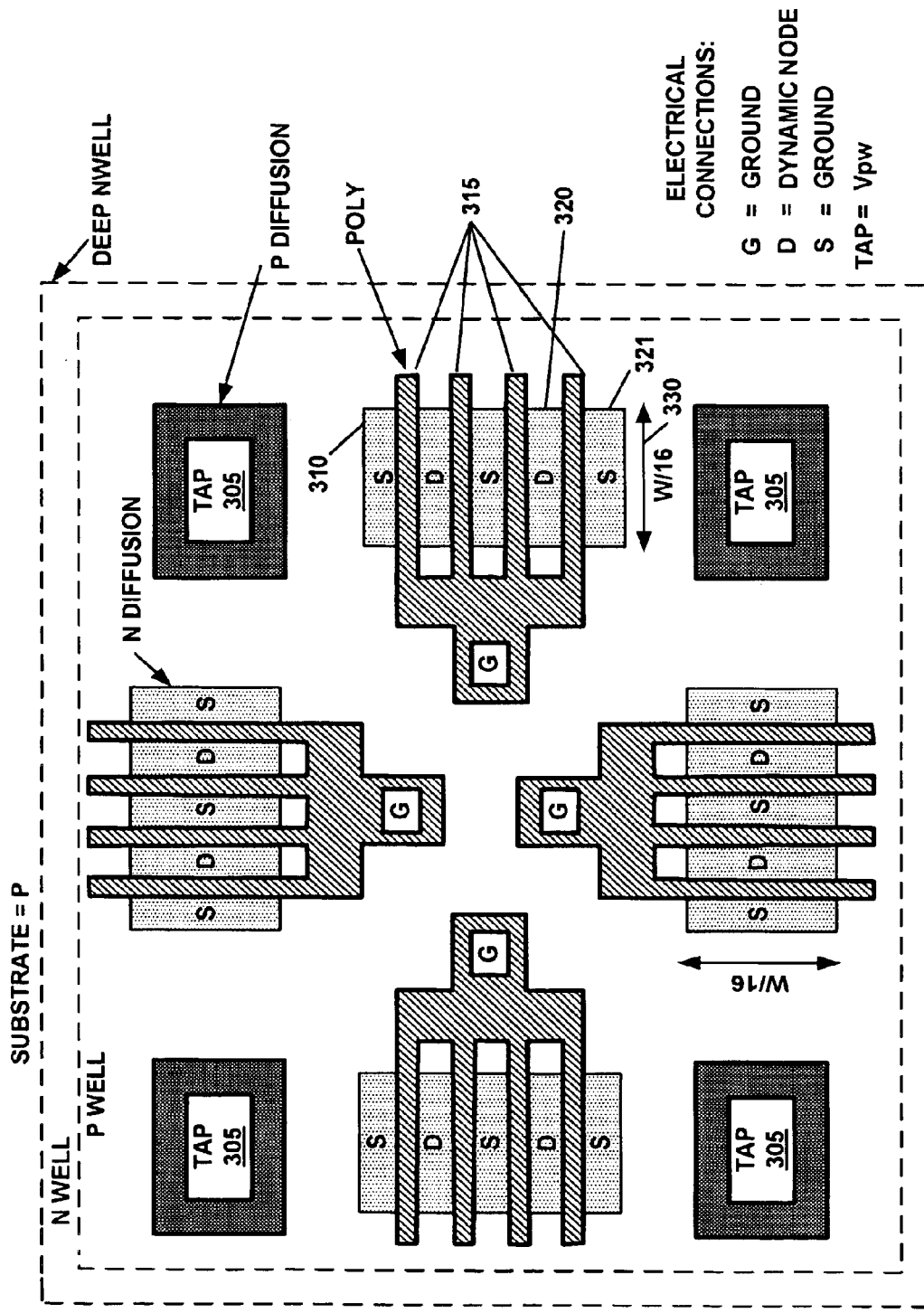
FIG. 15 illustrates one embodiment of a layout of transistors with backbias control that can be used with a leakage current measurement system in accordance with the present invention.

FIG. 15 shows an embodiment of a layout of several NMOS transistors with backbias control (e.g., NMOS device 204 of FIG. 11) that are arranged orthogonally. Four multi-fingered (or folded) transistors are shown, each having four fingers. Each transistor is on top of the P-well. The P-well is surrounded by an N-well ring, and both the P-well and the N-well ring are on top of a Deep-Nwell (DNW). The DNW is on top of the P-substrate. The N-well ring and the DNW are used to isolate Vpw from Vpw0; therefore, they are not needed in a case in which Vpw=Vpw0. Each transistor comprises an N-diffusion region 310 and a gate 315 formed with one or more gate fingers formed with polysilicon. The drain 320 and the source 321 are the alternating sub-regions of the N-diffusion region 310.

For the NMOS device 204 of FIG. 11, drain 320 of FIG. 15 is electrically connected to dynamic node 109 (FIG. 1). The source 321 and the gate 315 are electrically connected to ground. The P-diffusion tap 305 is connected to Vpw. In an alternate embodiment, source 321 is connected to dynamic node 109 and drain 320 is connected to ground. In one embodiment, the effective width W of the entire leakage test device is the number of gate fingers times the individual device width 330. In the example of FIG. 15 and in the other examples illustrated by FIGS. 16–18, four multi-fingered transistors are shown, each having four fingers; the individual device width is given as W/16 for consistency with equations (1)–(4).

Figure 16:
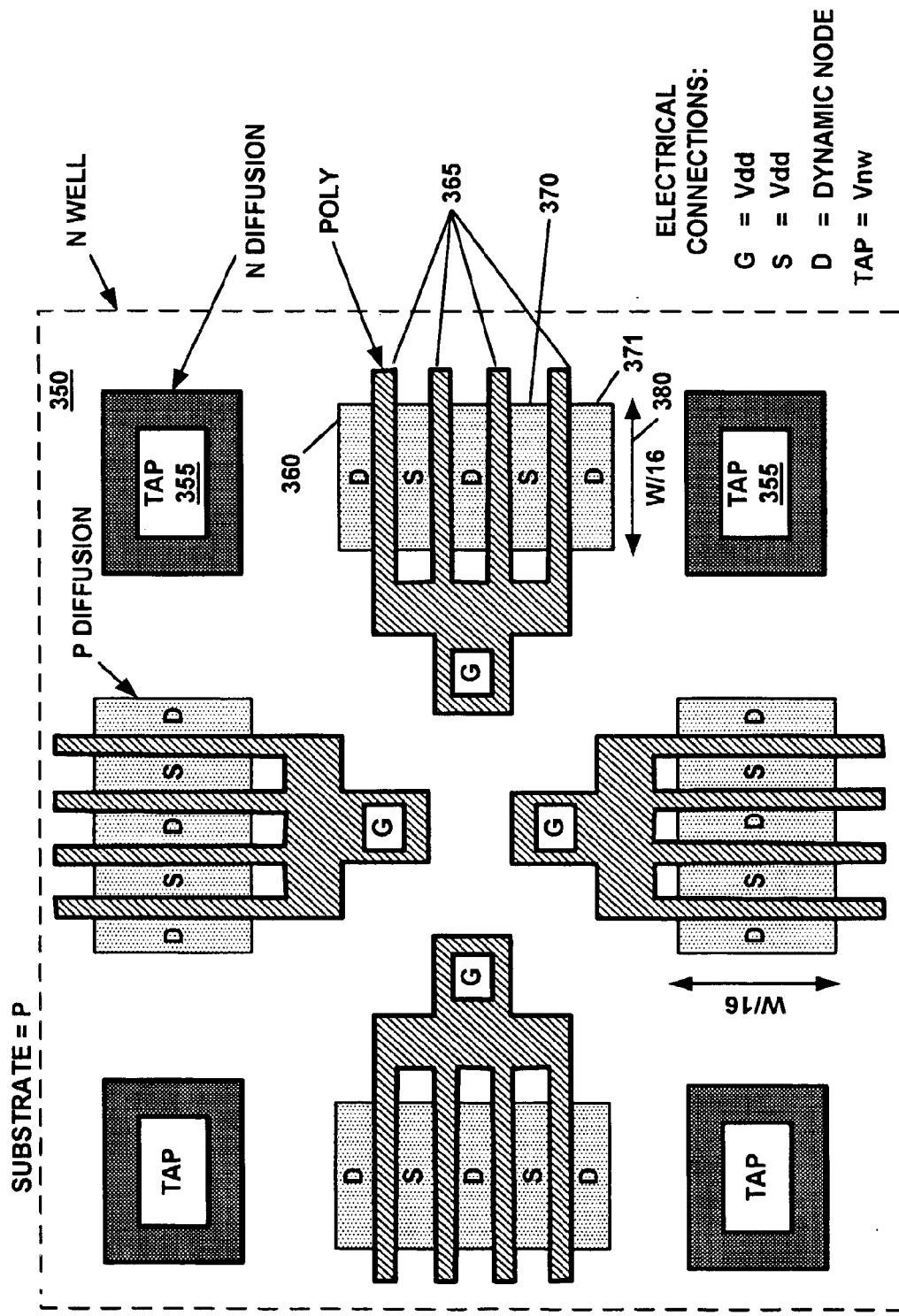
FIG. 16 illustrates a second embodiment of a layout of transistors with backbias control that can be used with a leakage current measurement system in accordance with the present invention.

FIG. 16 shows an embodiment of a layout of several PMOS transistors with backbias control (e.g., PMOS device 205 of FIG. 12) that are arranged orthogonally. Four multi-fingered (or folded) transistors are shown, each with four fingers. Each transistor is on top of an N-well 350 formed in a P-substrate. Each transistor comprises a P-diffusion region 360 and a gate 365 formed with one or more gate fingers formed with polysilicon. The drain 371 and the source 370 are the alternating sub-regions of the P-diffusion region 360.

For the PMOS device 205 of FIG. 12, drain 371 of FIG. 16 is connected to the dynamic node 109 (FIG. 1) while the source 370 and the gate 365 are connected to Vdd. The N-diffusion tap 355 is connected to Vnw. In an alternate embodiment, drain 371 is connected to ground while the source 370 is connected to the dynamic node 109. In one embodiment, the effective width of the entire leakage test device is the number of gate fingers times the individual device width 380.

Figure 17:
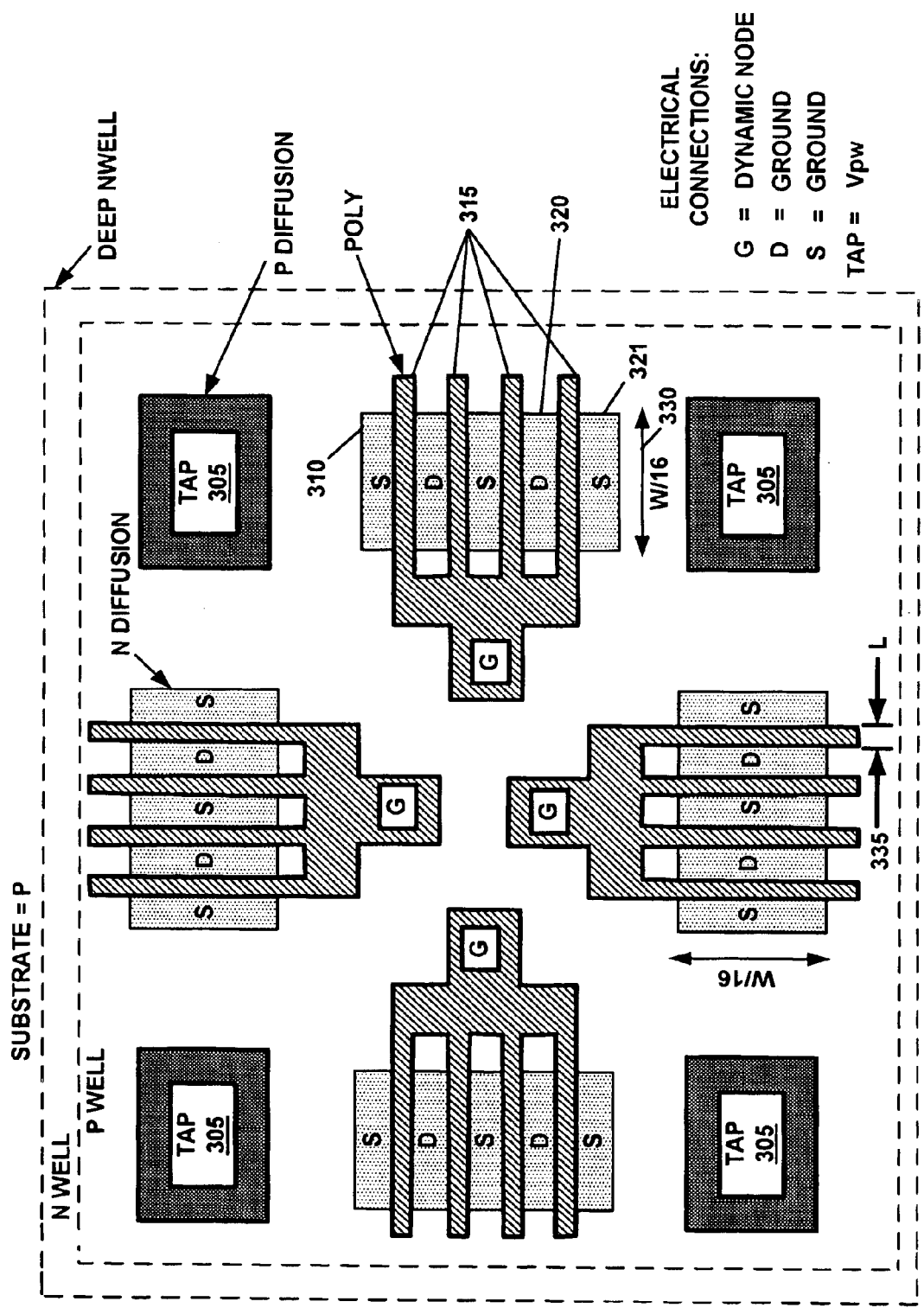
FIG. 17 illustrates a third embodiment of a layout of transistors with backbias control that can be used with a leakage current measurement system in accordance with the present invention.

FIG. 17 shows an embodiment of a layout of several NMOS transistors with backbias control (e.g., NMOS device 206 of FIG. 13) arranged orthogonally. Four multi-fingered (or folded) transistors are shown, each with four fingers. Each transistor is on top of the P-well. The P-well is surrounded by an N-well ring, and both the P-well and the N-well ring are on top of Deep-Nwell (DNW). The DNW is on top of the P-substrate. The N-well ring and the DNW are used to isolate Vpw from Vpw0; therefore, they are not needed in a case in which Vpw=Vpw0. Each transistor is on top of the P-substrate. Each transistor comprises an N-diffusion region 310 and a gate 315 formed with one or more gate fingers formed with polysilicon. The drain 320 and the source 321 are the alternating sub-regions of the N-diffusion region 310.

For the NMOS device 206 of FIG. 13, the gate 315 of FIG. 17 is electrically connected to dynamic node 109 (FIG. 1) and the drain 320 and the source 321 are electrically connected to ground. The P-diffusion tap 305 is electrically connected to Vpw. In one embodiment, the effective width of the entire leakage test device is the number of gate fingers times the individual device width 330. The effective length of a transistor is the individual gate length 335.

Figure 18:
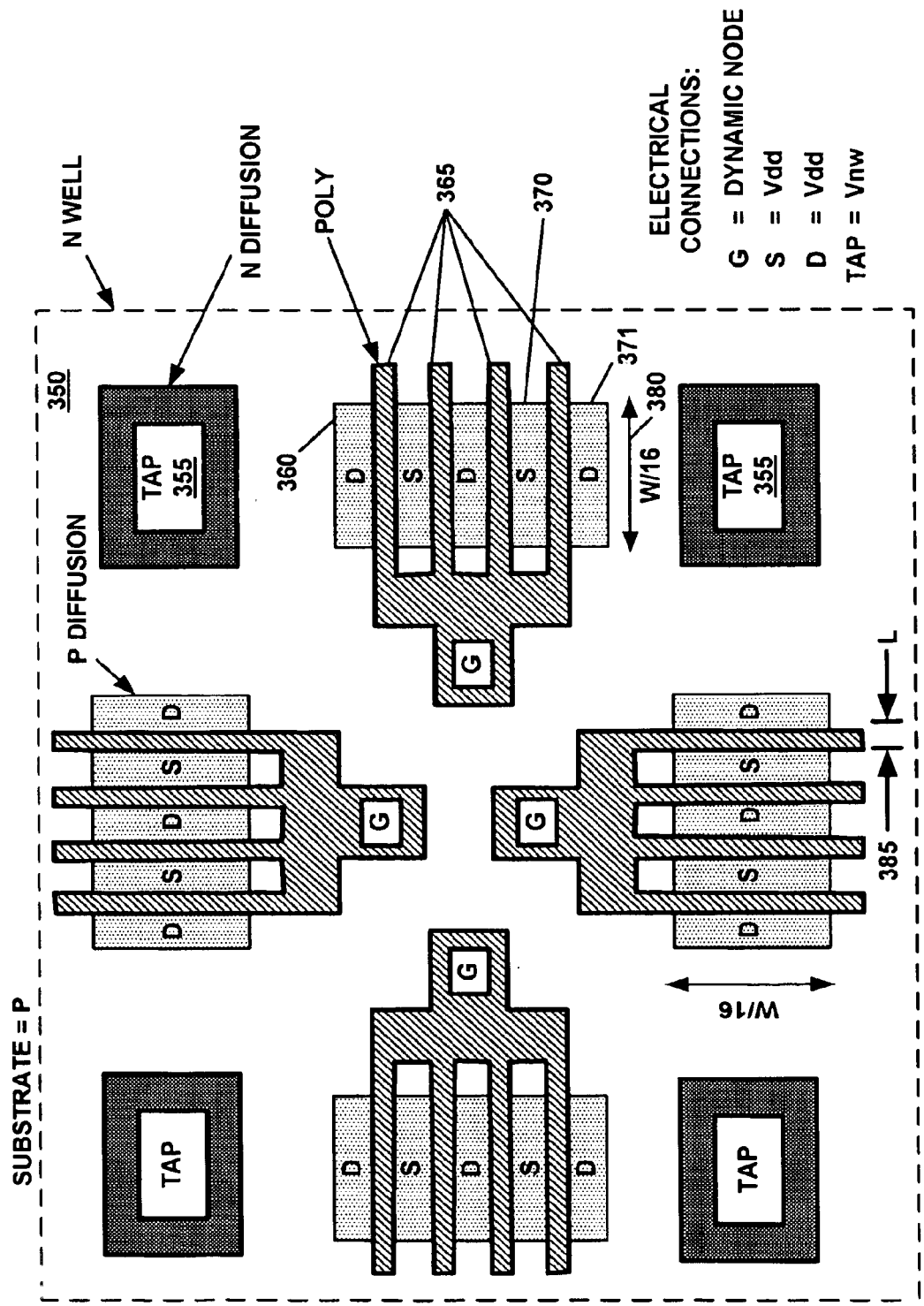
FIG. 18 illustrates a fourth embodiment of a layout of transistors with backbias control that can be used with a leakage current measurement system in accordance with the present invention.

FIG. 18 shows an embodiment of a layout of several PMOS transistors with backbias control (e.g., PMOS device 207 of FIG. 14) arranged orthogonally. Four multi-fingered (or folded) transistors are shown. Each transistor is on top of an N-well 350 formed in a P-substrate. Each transistor comprises a P-diffusion region 360 and a gate 365 formed with one or more gate fingers formed with polysilicon. The drain 371 and the source 370 are the alternating sub-regions of the P-diffusion region 360.

For the PMOS device 207 of FIG. 14, the drain 371 and the source 370 of FIG. 18 are connected to Vdd. The N-diffusion tap 355 is connected to Vnw while the gate 365 is connected to the dynamic node 109. In one embodiment, the effective width of the entire leakage test device is the number of gate fingers times the individual device width 380. The effective length of the transistor is the individual gate length 385.

Figure 19:
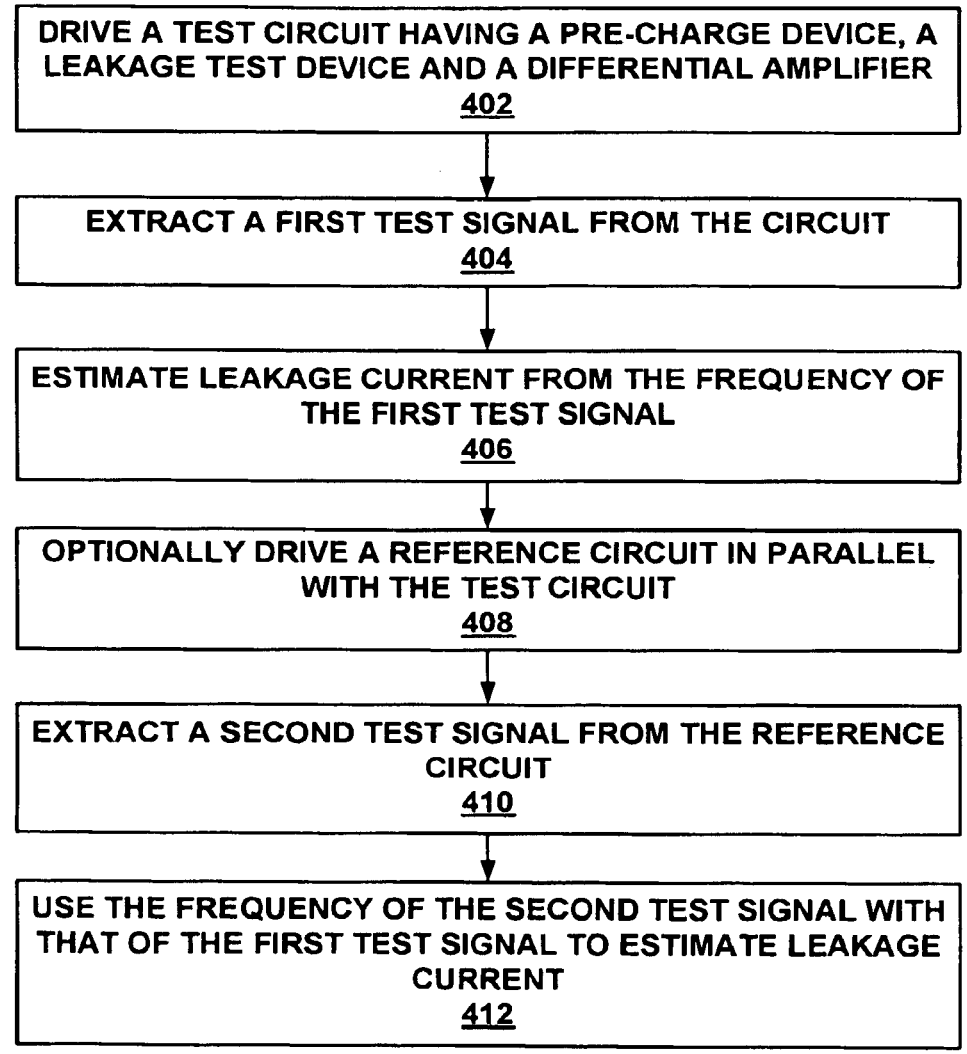
FIG. 19 is a flowchart of a method for measuring leakage current according to one embodiment of the present invention.

FIG. 19 is a flowchart 400 of a method for measuring leakage current according to one embodiment of the present invention. Although specific steps are disclosed in flowchart 400, such steps are exemplary. That is, embodiments of the present invention are well suited to performing various other steps or variations of the steps recited in flowchart 400. It is appreciated that the steps in flowchart 400 may be performed in an order different than presented, and that not all of the steps in flowchart 400 may be performed.

In step 402, a test circuit comprising a pre-charge device, a leakage test device and a differential amplifier (e.g., ring oscillator 90 of FIG. 1) is driven as described previously herein. In brief, the pre-charge device is turned on to drive a first node to a value other than (e.g., not equal to) a reference voltage, turning off the pre-charge device. For example, in the system of FIG. 3, the first node is driven to greater than the reference voltage, while in the system of FIG. 4, the first node is driven to less than the reference voltage. The first node is brought to the reference voltage as a result of a leakage current. For example, in the system of FIG. 3, the first node is reduced to the reference voltage as a result of the leakage current, while in the system of FIG. 4, the first node is raised to the reference voltage as a result of the leakage current. By bringing the first node to the reference voltage, a second node is driven to a high value that turns on the pre-charge device again. A first test signal is generated from the turning on and the turning off of the pre-charge device.

In step 404 of FIG. 19, the first test signal is extracted from the test circuit.

In step 406, the leakage current is estimated from the frequency of the first test signal. The frequency corresponds to the frequency at which the pre-charge device is turned on and off.

In step 408, in one embodiment, a reference circuit (e.g., reference circuit 60 of FIG. 5) is driven in parallel to the test circuit, wherein the reference circuit is isolated from the pre-charge device and the leakage test device of the test circuit.

In step 410 of FIG. 19, in one embodiment, a second test signal is extracted from the reference circuit.

In step 412, in one embodiment, the frequency of the second test signal is used with the frequency of the first test signal to estimate the leakage current.

The present invention, systems and methods thereof for measuring leakage current under various backbias voltage conditions, has thus been disclosed. Using the present invention, an accurate estimate of the leakage current associated with a particular circuit device on a particular chip is obtained. It should be appreciated that the each embodiment may also be implemented in other equivalent manners without departing from the scope and spirit of the present invention. While the present invention has been described in particular embodiments, it should be appreciated that the present invention should not be construed as limited by such embodiments, but rather construed according to the below claims.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit for measuring leakage current, said circuit comprising:
    a pre-charge device subject to a first backbias voltage;
    a leakage test device subject to a second backbias voltage, said leakage test device coupled to said pre-charge device, said leakage test device biased to an off state;
    a differential amplifier coupled to said pre-charge device and said leakage test device; and
    a delay unit coupled to said differential amplifier and to an input of said pre-charge device; wherein said pre-charge device is turned on and off at a frequency that corresponds to said leakage current.

2. The circuit of claim 1 wherein said leakage current is a transistor leakage current.

3. The circuit of claim 1 wherein said leakage current is a gate leakage current.

4. The circuit of claim 1 wherein said pre-charge device comprises a positive-channel metal-oxide semiconductor (PMOS) transistor and said leakage test device comprises a negative-channel metal-oxide semiconductor (NMOS) transistor.

5. The circuit of claim 1 wherein said pre-charge device comprises an NMOS transistor and said leakage test device comprises a PMOS transistor.

6. The circuit of claim 1 further comprising a voltage generator for generating said first backbias voltage and said second backbias voltage.

7. The circuit of claim 1 wherein said first and second backbias voltages are controlled independently of each other.

8. The circuit of claim 1 wherein said first and second backbias voltages are different from each other.

9. The circuit of claim 8 wherein said first backbias voltage is equal to a supply voltage Vdd.

10. The circuit of claim 1 wherein said circuit comprises other devices that are of the same type as said leakage test device, wherein said second backbias voltage and backbias voltages applied to said other devices are equal.

11. The circuit of claim 1 further comprising:
    a test signal measurement unit coupled to said differential amplifier, wherein an output of said test signal measurement unit is used for calculating a value of leakage current.

12. The circuit of claim 11 further comprising:
    a reference signal measurement unit;
    a reference differential amplifier coupled to said reference signal measurement unit; and
    a reference delay unit coupled to said reference differential amplifier, wherein an output of said reference signal measurement unit is used with said output of said test signal measurement unit to calculate said value of leakage current.

13. A circuit for measuring leakage current, said circuit comprising:
    a pre-charge device subject to a first backbias voltage, said pre-charge device coupled to a first node;
    a leakage test device subject to a second backbias voltage, said leakage test device also coupled to said first node, said leakage test device biased to an off state but having a leakage current; and
    a differential amplifier coupled to said first node and to a second node that is coupled to an input of said pre-charge device; wherein said pre-charge device is turned on to drive said first node to a voltage not equal to a reference voltage, wherein said pre-charge device is then turned off; wherein said leakage current brings said first node to said reference voltage, driving said second node to a high value that turns said pre-charge device on again; and wherein said pre-charge device is turned on and off at a frequency that is proportional to said leakage current.

14. The circuit of claim 13 wherein said leakage current is a transistor leakage current.

15. The circuit of claim 13 wherein said leakage current is a gate leakage current.

16. The circuit of claim 13 wherein said pre-charge device comprises a positive-channel metal-oxide semiconductor (PMOS) transistor and said leakage test device comprises a negative-channel metal-oxide semiconductor (NMOS) transistor.

17. The circuit of claim 13 wherein said pre-charge device comprises an NMOS transistor and said leakage test device comprises a PMOS transistor.

18. The circuit of claim 13 further comprising a voltage generator for generating said first backbias voltage and said second backbias voltage.

19. The circuit of claim 13 wherein said first and second backbias voltages are controlled independently of each other.

20. The circuit of claim 13 wherein said first and second backbias voltages are different from each other.

21. The circuit of claim 20 wherein said first backbias voltage is equal to a supply voltage Vdd.

22. The circuit of claim 13 wherein said circuit comprises other devices that are of the same type as said leakage test device, wherein said second backbias voltage and backbias voltages applied to said other devices are equal.

23. The circuit of claim 13 further comprising:
    a test signal measurement unit coupled to said differential amplifier, wherein an output of said test signal measurement unit is used for calculating a value of leakage current.

24. The circuit of claim 23 further comprising:
    a reference signal measurement unit;
    a reference differential amplifier coupled to said reference signal measurement unit; and
    a reference delay unit coupled to said reference differential amplifier, wherein an output of said reference signal measurement unit is used with said output of said test signal measurement unit to calculate said value of leakage current.

25. The circuit of claim 13 wherein said first node is driven to greater than said reference voltage, wherein said leakage current reduces said first node to said reference voltage.

26. The circuit of claim 13 wherein said first node is driven to less than said reference voltage, wherein said leakage current raises said first node to said reference voltage.

27. A method for measuring leakage current, said method comprising:

driving a circuit comprising a pre-charge device, a leakage test device and a differential amplifier, wherein said pre-charge device is subject to a first backbias voltage and said leakage test device is subject to a second backbias voltage, said leakage test device biased to an off state and having a leakage current, wherein said leakage test device and said pre-charge device are coupled to a first node and wherein said differential amplifier is coupled to said first node and to a second node that is coupled to an input of said pre-charge device;

extracting a first test signal from said circuit, said first test signal having a first frequency; and estimating said leakage current from said first frequency.

28. The method of claim 27 wherein said driving further comprises:

turning on said pre-charge device to drive said first node to greater than reference voltage, turning off said pre-charge device; and reducing said first node to said reference voltage as a result of said leakage current, wherein said second node is driven to a high value that turns on said pre-charge device again;

wherein said first test signal is generated from said turning on and said turning off of said pre-charge device, said first frequency corresponding to the frequency at which said pre-charge device is turned on and off.

29. The method of claim 27 wherein said driving further comprises:

turning on said pre-charge device to drive said first node to less than a reference voltage, turning off said pre-charge device; and raising said first node to said reference voltage as a result of said leakage current, wherein said second node is driven to a high value that turns on said pre-charge device again;

wherein said first test signal is generated from said turning on and said turning off of said pre-charge device, said first frequency corresponding to the frequency at which said pre-charge device is turned on and off.

30. The method of claim 27 wherein said first and second backbias voltages are controlled independently of each other.

31. The method of claim 27 wherein said first and second backbias voltages are different from each other.

32. The method of claim 31 wherein said first backbias voltage is equal to a supply voltage Vdd.

33. The method of claim 27 wherein said circuit comprises other devices that are of the same type as said leakage test device, wherein said second backbias voltage and backbias voltages applied to said other devices are equal.

34. The method of claim 27 further comprising:

driving a reference circuit in parallel to said driving of said circuit, wherein said reference circuit is isolated from said pre-charge device and said leakage test device;

extracting a second test signal from said reference circuit, said second test signal having a second frequency; and using said second frequency in said estimating of said leakage current.

* * * * *